United States Patent
Kondo et al.

(10) Patent No.: US 11,584,886 B2
(45) Date of Patent: Feb. 21, 2023

(54) CERAMIC COMPLEX, LIGHT EMITTING DEVICE USING THE SAME, AND METHOD FOR PRODUCING CERAMIC COMPLEX

(71) Applicant: NICHIA CORPORATION, Anan (JP)

(72) Inventors: Masaki Kondo, Tokushima (JP); Yasuaki Mashima, Tokushima (JP)

(73) Assignee: NICHIA CORPORATION, Anan (JP)

( * ) Notice: Subject to any disclaimer, the term of this patent is extended or adjusted under 35 U.S.C. 154(b) by 778 days.

(21) Appl. No.: 16/444,504

(22) Filed: Jun. 18, 2019

(65) Prior Publication Data
US 2019/0389763 A1 Dec. 26, 2019

(30) Foreign Application Priority Data
Jun. 20, 2018 (JP) .............................. JP2018-117112

(51) Int. Cl.
| | |
|---|---|
| C09K 11/77 | (2006.01) |
| H01L 33/50 | (2010.01) |
| C03C 3/32 | (2006.01) |
| C03C 14/00 | (2006.01) |
| C03C 12/00 | (2006.01) |

(52) U.S. Cl.
CPC .......... *C09K 11/7774* (2013.01); *C03C 3/325* (2013.01); *C03C 12/00* (2013.01); *C03C 14/004* (2013.01); *H01L 33/504* (2013.01); *C03C 2214/30* (2013.01)

(58) Field of Classification Search
CPC ............ C09K 11/7706; C09K 11/7734; C09K 11/7721
See application file for complete search history.

(56) References Cited

U.S. PATENT DOCUMENTS

| | | |
|---|---|---|
| 7,514,723 B2 | 4/2009 | Arndt et al. |
| 2005/0127377 A1 | 6/2005 | Arndt et al. |
| 2009/0072700 A1* | 3/2009 | Kameshima .......... C03C 14/004 264/483 |

(Continued)

FOREIGN PATENT DOCUMENTS

| | | |
|---|---|---|
| CN | 108069710 A | 5/2018 |
| JP | 2003258308 A | 9/2003 |

(Continued)

OTHER PUBLICATIONS

Ji. Thermally stable phosphor-in-glass for enhancement of characteristic in high power LED applications.Materials Letters vol. 157, Oct. 15, 2015, pp. 89-92 (Year: 2015).*

*Primary Examiner* — Matthew E. Hoban
(74) *Attorney, Agent, or Firm* — Hunton Andrews Kurth LLP (57) ABSTRACT

Provided is a ceramic complex having high luminous characteristics. Proposed is a ceramic complex including a rare earth aluminate fluorescent material, glass, and calcium fluoride, wherein, when the total amount of the rare earth aluminate fluorescent material, the glass, and the calcium fluoride is taken as 100% by volume, the content of the rare earth aluminate fluorescent material is in a range of 15% by volume or more and 60% by volume or less, the content of the glass is in a range of 3% by volume or more and 84% by volume or less, and the content of the calcium fluoride is in a range of 1% by volume or more and 60% by volume of less.

12 Claims, 4 Drawing Sheets

(56) References Cited

U.S. PATENT DOCUMENTS

2016/0152515 A1    6/2016  Okamoto et al.

FOREIGN PATENT DOCUMENTS

| JP | 2005512331 A | 4/2005 |
| JP | 2015137283 A | 7/2015 |
| JP | 2016069240 A | 5/2016 |
| JP | 2016108216 A | 6/2016 |
| WO | 2015008621 A1 | 1/2015 |
| WO | 2018083903 A1 | 5/2018 |

* cited by examiner

FIG. 4

CERAMIC COMPLEX, LIGHT EMITTING DEVICE USING THE SAME, AND METHOD FOR PRODUCING CERAMIC COMPLEX

CROSS-REFERENCE TO RELATED PATENT APPLICATION

This application claims priority to Japanese Patent Application No. 2018-117112, filed on Jun. 20, 2018, the disclosure of which is hereby incorporated by reference in its entirety.

BACKGROUND

Technical Field

The present invention relates to a ceramic complex, a light emitting device using the same, and a method for producing a ceramic complex.

Description of Related Art

A ceramic complex containing a fluorescent material that converts a wavelength of light emitted from a light emitting element such as a light emitting diode (hereinafter also referred to as "LED") or a laser diode (hereinafter also referred to as "LD") is being utilized as a light emitting device used for automobile, ordinary lighting, backlight of liquid crystal display device, projector.

Examples of the fluorescent material that converts light emitted from a light emitting element may include a rare earth aluminate fluorescent material containing a rare earth element such as yttrium or lutetium. As a ceramic complex containing such an inorganic fluorescent material, for example, Japanese Unexamined Patent Publication No. 2003-258308 discloses a sintered body in which an inorganic fluorescent material is dispersed into glass having a softening point higher than 500° C. In this specification, the "fluorescent material" is used in the same meaning as a "fluorescent phosphor".

However, in regard to the sintered body disclosed in Japanese Unexamined Patent Publication No. 2003-258308, further improvements are required in luminous characteristics (for example, in luminous efficiency) when converting a wavelength of light emitted from a light emitting element such as an LED or an LD.

Thus, an embodiment of the present disclosure has an object to provide a ceramic complex that is enhanced in luminous characteristics, a light emitting device using the same, and a method for producing a ceramic complex.

SUMMARY

The ceramic complex according to the present disclosure is a ceramic complex comprising a rare earth aluminate fluorescent material, glass, and calcium fluoride, in which, when the total amount of the rare earth aluminate fluorescent material, the glass, and the calcium fluoride is taken as 100% by volume, the content of the rare earth aluminate fluorescent material is in a range of 15% by volume or more and 60% by volume or less, the content of the glass is in a range of 3% by volume or more and 84% by volume or less, and the content of the calcium fluoride is in a range of 1% by volume or more and 60% by volume of less.

The light emitting device according to the present disclosure comprises the ceramic complex and a light source that emits light exciting the rare earth aluminate fluorescent material.

The method for producing a ceramic complex according to the present disclosure comprises preparing a molded body containing a rare earth aluminate fluorescent material, glass, and calcium fluoride, in which the content of the rare earth aluminate fluorescent material is in a range of 15% by volume or more and 60% by volume or less, the content of the glass is in a range of 3% by volume or more and 84% by volume or less, and the content of the calcium fluoride is in a range of 1% by volume or more and 60% by volume of less relative to the total amount of the rare earth aluminate fluorescent material, the glass, and the calcium fluoride by volume; and calcining the molded body.

In accordance with the embodiments of the present disclosure, a ceramic complex having high luminous characteristics, a light emitting device using the same, and a method for producing a ceramic complex, can be provided.

DETAILED DESCRIPTION

The ceramic complex, the light emitting device using the same, and the method for producing a ceramic complex according to the embodiments of the present invention are hereunder described. The embodiments shown below are exemplifications for exemplifying the technical idea of the present invention, and the present disclosure is not limited to the ceramic complex, the light emitting device using the same, and the method for producing a ceramic complex mentioned below. Standards according to Japanese Industrial Standard (JIS) Z8110 are applied to the relations between color names and chromaticity coordinates, the relations between wavelength ranges of light and color names of monochromatic lights.

Ceramic Complex

The ceramic complex contains a rare earth aluminate fluorescent material, glass, and calcium fluoride, and when the total amount of the rare earth aluminate fluorescent material, the glass, and the calcium fluoride is taken as 100% by volume, the content of the rare earth aluminate fluorescent material is in a range of 15% by volume or more and 60% by volume or less, the content of the glass is in a range of 3% by volume or more and 84% by volume or less, and the content of the calcium fluoride is in a range of 1% by volume or more and 60% by volume of less.

The ceramic complex contains glass as a base material, a rare earth aluminate fluorescent material, and calcium fluoride. Since the ceramic complex contains the calcium fluoride in a range of 1% by volume or more and 60% by volume or less in the glass serving as a base material, light incident into the ceramic complex is scattered in the inside of the ceramic complex by the calcium fluoride having a lower refractive index than that of the glass serving as a base material, and the passing through of the incident light to the outside of the ceramic complex can be suppressed. The ceramic complex contains the rare earth aluminate fluorescent material in the glass as a base material, in addition to the calcium fluoride. Thus, in the inside of the ceramic complex, the wavelength of the light that is scattered by the calcium fluoride is efficiently converted by the rare earth aluminate fluorescent material by repeating the scattering, and the light is emitted to the outside of the ceramic complex, so that the luminous efficiency can be enhanced. In addition, the light incident into the ceramic complex is scattered by the calcium fluoride contained in the base material, so that the ceramic complex can emit light that is further converged to a nearly vertical direction to the emission surface, and the light emitted from the ceramic complex can be converged in a desired position.

The content of the rare earth aluminate fluorescent material in the ceramic complex is, when the total amount of the rare earth aluminate fluorescent material, the glass, and the calcium fluoride is taken as 100% by volume, in a range of 15% by volume or more and 60% by volume or less, and preferably 16% by volume or more, more preferably 17% by volume or more, even more preferably 18% by volume or more. When the content of the rare earth aluminate fluorescent material in the ceramic complex is in a range of 15% by volume or more and 60% by volume or less, a ceramic complex having desired luminous efficiency and relative density can be obtained.

The content of the calcium fluoride in the ceramic complex is, when the total amount of the rare earth aluminate fluorescent material, the glass, and the calcium fluoride is taken as 100% by volume, in a range of 1% by volume or more and 60% by volume or less, and preferably in a range of 2% by volume or more and 58% by volume or less, more preferably in a range of 3% by volume or more and 55% by volume or less, even more preferably in a range of 5% by volume or more and 50% by volume or less. When the content of the calcium fluoride in the ceramic complex is in a range of 1% by volume or more and 60% by volume or less, a ceramic complex having high luminous efficiency can be obtained by scattering the incident light.

The content of the glass in the ceramic complex is not particularly limited as long as the content of the rare earth aluminate fluorescent material is in a range of 15% by volume or more and 60% by volume or less and the content of the calcium fluoride is in a range of 1% by volume or more and 60% by volume or less, when the total amount of the rare earth aluminate fluorescent material, the glass, and the calcium fluoride is taken as 100% by volume; and the glass may be contained such that the total amount of the rare earth aluminate fluorescent material, the glass, and the calcium fluoride does not exceed 100% by volume. When the content of the glass in the ceramic complex is in a range of 3% by volume or more and 84% by volume or less, a stable base material is formed by the glass, so that a ceramic complex having high luminous efficiency and durability can be obtained. The content of the glass in the ceramic complex is preferably in a range of 5% by volume or more and 82% by volume or less, more preferably in a range of 10% by volume or more and 80% by volume or less, even more preferably in a range of 12% by volume or more and 77% by volume or less The ceramic complex preferably has a relative density in a range of 90% or more and 100% or less. When the relative density of the ceramic complex is in a range of 90% or more and 100% or less, the transmittance of the light of which the wavelength is efficiently converted by the rare earth aluminate fluorescent material becomes high, so that the light extraction efficiency can be enhanced.

Relative Density of Ceramic Complex

The relative density of the ceramic complex refers to a value calculated by an apparent density of the ceramic complex relative to a true density of the ceramic complex. The relative density is calculated according to the following formula (1).

Relative density (%) of ceramic complex=(Apparent density of ceramic complex÷True density of ceramic complex)×100 (1)

When a mass ratio (% by mass) of the glass contained in the ceramic complex is defined as $G_m$, a true density (g/cm$^3$) of the glass is defined as $G_d$, a mass ratio (% by mass) of the rare earth aluminate fluorescent material is defined as $P_m$, a true density (g/cm$^3$) of the rare earth aluminate fluorescent material is defined as $P_d$, a mass ratio (% by mass) of the calcium fluoride is defined as $C_m$, and a true density (g/cm$^3$) of the calcium fluoride is defined as $C_d$, the true density of the ceramic complex is calculated according to the following formula (2).

$$\text{True density of ceramic complex} = \frac{G_m + P_m + C_m}{(G_m/G_d) + (P_m/P_d) + (C_m/C_d)} \quad (2)$$

Mass ratio (% by mass) of rare earth aluminate fluorescent material: $P_m$
True density (g/cm$^3$) of rate earth aluminate fluorescent material: $P_d$
Mass ratio (% by mass) of glass: $G_m$
True density (g/cm$^3$) of glass: $G_d$
Mass ratio (% by mass) of calcium fluoride: $C_m$
True density (g/cm$^3$) of calcium fluoride: $C_d$
$G_m+P_m+G_m=100$ The apparent density of the ceramic complex refers to a value obtained by dividing the mass (g) of the ceramic complex by the volume (cm$^3$) of the ceramic complex determined by the Archimedes' method. The apparent density of the ceramic complex is calculated according to the following formula (3).

Apparent density of ceramic complex=Mass (g) of ceramic complex÷Volume (cm$^3$) of ceramic complex (Archimedes' method) (3)

The ceramic complex may be a plate-shaped body having a first principal surface serving as an incident surface of light and a second principal surface serving as an emission surface of light, which is positioned on the opposite side to the first principal surface, and preferably has a plate thickness in a range of 90 μm or more and 300 μm or less. With this arrangement, the incident light and the light of which the wavelength is converted by the rare earth aluminate fluorescent material are scattered by the calcium fluoride contained in the ceramic complex, so that the light extraction efficiency can be enhanced and the mechanical strength can be maintained. The plate thickness of the ceramic complex that is the plate-shaped body is more preferably in a range of 95 μm or more and 250 μm or less, even more preferably in a range of 100 μm or more and 200 μm or less.

The ceramic complex preferably has a ratio (light diameter of emission light/light diameter of incident light) of a light diameter of emission light that is emitted from the second principal surface to a light diameter of incident light that is incident into the first principal surface in a range of 0.400 or more and 0.990 or less. Among others, the ratio is more preferably in a range of 0.450 or more and 0.985 or less, even more preferably in a range of 0.500 or more and 0.980 or less, still more preferably in a range of 0.550 or more and 0.975 or less, particularly preferably in a range of 0.600 or more and 0.970 or less. When the ratio (hereinafter also referred to as "light diameter ratio (emission light/incident light)" in some cases) of a light diameter of emission light that is emitted from the second principal surface to a light diameter of incident light that is incident into the first principal surface of the ceramic complex is in a range of 0.400 or more and 0.990 or less, the light emitted from the ceramic complex can be converged in a desired position. The light diameter of the incident light that is incident into the first principal surface of the ceramic complex is a light diameter of light emitted from a light source. The light diameter of the incident light can be measured, for example, with a color luminance meter. The light diameter of the incident light is preferably in a range of 1 mm or more and 5 mm or less, more preferably in a range of 2 mm or more and 4 mm or less. The light diameter of the emission light that is emitted from the second principal surface of the ceramic complex can be measured as follows: light emission luminance of the light emitted from the ceramic complex is measured with a color luminance meter; a position exhibiting the maximum luminance in the obtained light emission spectrum is defined as a center (measuring center); distances (mm) of two positions where the luminance becomes one-hundredth of the maximum luminance in the light emission spectrum (hereinafter referred to as "one-hundredth luminance" in some cases) from the measuring center are each measured in terms of an absolute value; and the sum of the absolute values of the distances (mm) of the two positions where the luminance becomes one-hundredth of the maximum luminance in the light emission spectrum from the measuring center is determined as the light diameter of the emission light that is emitted from the second principal surface.

Rare Earth Aluminate Fluorescent Material

The rare earth aluminate fluorescent material preferably has an average particle diameter in a range of 15 μm or more and 40 μm or less. Among others, the average particle diameter is more preferably in a range of 18 μm or more and 38 μm or less, even more preferably in a range of 20 μm or more and 35 μm or less. With this arrangement, the wavelength of the light that is incident into the ceramic complex can be efficiently converted, and the luminous efficiency can be improved. In addition, the fluorescent material can be uniformly disposed in the ceramic complex. The average particle diameter of the rare earth aluminate fluorescent material can be measured according to a Fisher Sub-Sieve Sizer method (hereinafter also referred to as "FSSS method"). The average particle diameter, as measured according to the FSSS method, is also referred to as a Fisher Sub-Sieve Sizer's number. The FSSS method is a method of measuring a specific surface area by utilizing the flow resistance of air according to an air permeability method to determine a particle diameter. Specifically, using a Fisher Sub-Sieve Sizer Model 95 (manufactured by Fisher Scientific Inc.), the rare earth aluminate fluorescent material is sampled in an amount of 1 cm³ under an environment at a temperature of 25° C. and a humidity of 70% RH, and packed in a dedicated tubular container. Then, a dry air flow is introduced therein under a constant pressure to read a specific surface area of the sample from the differential pressure, and thus the average particle diameter according to the FSSS method can be calculated.

The rare earth aluminate fluorescent material preferably contains a composition represented by the following formula (I).

$$(Ln_{1-a}Ce_a)_3(Al_cGa_b)_5O_{12} \quad (I)$$

wherein Ln is at least one rare earth element selected from the group consisting of Y, Gd, Lu, and Tb and may contain two or more rare earth elements; and a, b, and c each satisfy $0<a\leq0.022$, $0\leq b\leq0.4$, $0<c\leq1.1$, and $0.9\leq b+c\leq1.1$.

Ce is an activating element of the fluorescent material, and the product of the parameter a and 3 represents a molar ratio of Ce in the composition represented by the formula (I). The "molar ratio" expresses a molar amount of each element contained in one mole of the chemical composition of the rare earth aluminate fluorescent material. The parameter a is more preferably in a range of 0.00005 or more and 0.021 or less ($0.005\times10^{-2}\leq a\leq0.021$), even more preferably in a range of 0.0001 or more and 0.020 or less ($0.01\times10^{-2}\leq a\leq0.020$). The product of the parameter b and 5 represents a molar ratio of Ga. In order to obtain a desired particle diameter and color tone through the wavelength conversion, the parameter b may be in a range of 0.00001 or more and 0.35 or less ($0.001\times10^{-2}\leq b\leq0.35$), and may also be in a range of 0.00005 or more and 0.30 or less ($0.005\times10^{-2}\leq b\leq0.30$). The product of the parameter c and 5 represents a molar ratio of Al. The parameter c is preferably in a range of 0.5 or more and 1.1 or less ($0.5\leq c\leq1.1$), more preferably in a range of 0.6 or more and 1.0 or less ($0.6\leq c\leq1.0$). The sum of the parameter b and the parameter c is preferably in a range of 0.9 or more and 1.1 or less ($0.9\leq b+c\leq1.1$), more preferably in a range of 0.95 or more and 1.10 or less ($0.95\leq b+c\leq1.10$).

Glass

The glass contained in the ceramic complex preferably has a softening point of 500° C. or more. Among others, the softening point is more preferably 600° C. or more, even more preferably 700° C. or more. The raw material of the glass constituting the base material of the ceramic complex is preferably a glass powder. When the glass is a glass powder having a softening point of 500° C. or more as the raw material of the ceramic complex, in the case of obtaining a ceramic complex by mixing the raw materials followed by calcining, for example, at a temperature in a range of 800 to 1,200° C., the glass is not reacted with the rare earth aluminate fluorescent material, so that the resultant ceramic complex can be suppressed from being changed and blackish of the body color, and lowering of the luminous efficiency can be suppressed. In addition, when the softening point of the glass is 500° C. or more, the durability of the ceramic complex obtained by mixing with the rare earth aluminate fluorescent material and the calcium fluoride followed by calcining can be maintained. In other words, the deterioration of the ceramic complex surface can be suppressed even in a high-humidity environment, and the transmittance can be maintained to suppress lowering of the luminous efficiency. In the glass contained in the ceramic complex, the upper limit value of the softening point is not particularly limited, and the softening point is preferably 1,200° C. or less, more preferably 1,100° C. or less.

The type of the glass is not limited as long as the softening point is 500° C. or more. Examples of the glass may include borosilicate glass. Examples of the borosilicate glass may include barium-borosilicate glass and alumino-borosilicate glass. The glass is not readily reacted with components constituting the rare earth aluminate fluorescent material, and preferably does not contain components that discolor or color the glass by the reaction, for example, components of Pb, Bi, Fe, Mn, and Ce. Even when containing the components, the total amount of the components of 10,000 ppm or less in terms of oxide is allowed to be contained.

Calcium Fluoride

The ceramic complex contains calcium fluoride having a purity of calcium fluoride of 99.0% by mass or more. Among others, the purity of calcium fluoride is preferably 99.5% by mass or more. When the calcium fluoride having a purity of calcium fluoride of 99.0% by mass or more is contained in the ceramic complex, the light incident into the ceramic complex and the light of which the wavelength is converted by the rare earth aluminate fluorescent material are scattered, so that the luminous efficiency can be enhanced. In addition, the calcium fluoride has a relatively low reactivity with the rare earth aluminate fluorescent material when calcining to form the calcium fluoride. Thus, the deterioration of the rare earth aluminate fluorescent material is less, and a ceramic complex having high luminous efficiency and durability can be obtained. The calcium fluoride may be a single crystal having a purity of calcium fluoride of 99.0% by mass or more. Also, the calcium fluoride may be one having a powdery shape.

Method for Producing Ceramic Complex

Figure 1:
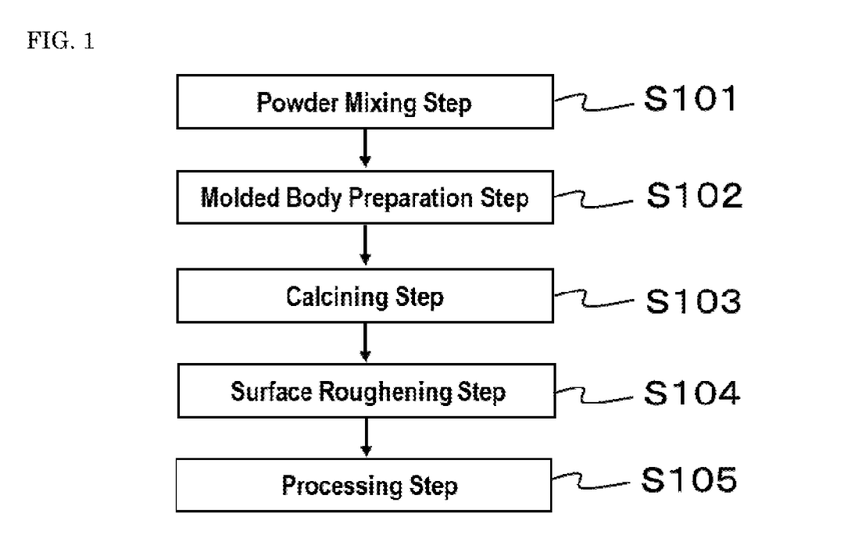
FIG. 1 is a flowchart describing a method for producing a ceramic complex according to the present disclosure.

FIG. 1 is a flowchart describing one example of the method for producing a ceramic complex according to the present disclosure. Steps in the method for producing a ceramic complex will be described referring to FIG. 1. The method for producing a ceramic complex includes a molded body preparation step S102 and a calcining step S103. The method for producing a ceramic complex may include a powder mixing step S101 prior to the molded body preparation step S102, may include a surface roughening step S104 of roughening the surface of the ceramic complex after the calcining step S103, and may include a processing step S105 of cutting the ceramic complex into a desired size or thickness. As for the order of the surface roughening step S104 and the processing step S105, the processing step S105 may be performed after the surface roughening step S104, or in a reverse order, the surface roughening step S104 may be performed after the processing step S105.

Powder Mixing Step

In the powder mixing step, powders constituting a molded body are mixed. The powders constituting a molded body preferably include rare earth aluminate fluorescent material particles, a glass powder, and a calcium fluoride powder. The powders can be mixed by using a mortar with a pestle. The powders may also be mixed by using a mixing medium, such as a ball mill. A small amount of a molding auxiliary, such as water or ethanol, may also be used to facilitate mixing of the powders and molding of the mixed powder. The molding auxiliary is preferably evaporated easily in the subsequent step of calcining. In the case of adding the molding auxiliary, the amount of the molding auxiliary is preferably 10% by volume or less, more preferably 8% by volume or less, even more preferably 5% by volume or less, relative to 100% by volume of the powder.

Molded Body Preparation Step

In the molded body preparation step, a mixed powder containing a rare earth aluminate fluorescent material, glass, and calcium fluoride, in which the content of the rare earth aluminate fluorescent material is in a range of 15% by volume or more and 60% by volume or less, the content of the glass is in a range of 3% by volume or more and 84% by volume or less, and the content of the calcium fluoride is in a range of 1% by volume or more and 60% by volume or less, relative to the total amount of the rare earth aluminate fluorescent material, the glass, and the calcium fluoride by volume, is obtained. The mixed powder is molded into a desired shape to obtain a molded body. The molding method of powder employed may be a known method such as a press molding method, and examples thereof may include a die press molding method, a cold isostatic pressing (hereinafter also referred to as "CIP") method. As for the molding method, two kinds of methods may be employed to adjust the shape of the molded body. CIP may be performed after die press molding. In the CIP, the molded body is preferably pressed by a cold hydro-isostatic pressing method using water as a medium.

The load in the die press molding is preferably in a range of 0.1 kg/cm$^2$ to 1.0 kg/cm$^2$, more preferably in a range of 0.2 kg/cm$^2$ to 0.5 kg/cm$^2$. When the load in the die press molding falls within the aforementioned range, the molded body can be adjusted to a desired shape.

The pressure in the CIP treatment is preferably in a range of 50 MPa to 200 MPa, more preferably in a range of 50 MPa to 180 MPa. When the pressure in the CIP treatment falls within the aforementioned range, the rare earth aluminate fluorescent material, the glass, and the calcium fluoride can be mixed such that a relative density of the ceramic complex obtained after calcining is preferably in a range of 90% or more and 100% or less, to thereby obtain a molded body in which the particles of those are brought into contact with each other.

Calcining Step

The calcining step is a step of calcining the molded body to obtain a ceramic complex. The molded body is preferably calcined in an atmosphere containing 5% by volume or more oxygen. The content of oxygen in the atmosphere is more preferably 10% by volume or more, even more preferably 15% by volume or more, and the atmosphere may be an atmospheric (the oxygen content is 20% by volume or more) atmosphere. When calcining in an atmosphere containing 5% by volume or more oxygen, the molded body is calcined in a state where the components in the molded body are tightly contacted with each other, so that a ceramic complex having a relative density preferably in a range of 90% or more and 100% or less can be obtained.

The calcining temperature is preferably in a range of 800° C. or more and 1,100° C. or less, more preferably in a range of 850° C. or more. When the calcining temperature is 800° C. or more, a ceramic complex having a relative density in a range of 90% or more and 100% or less can be obtained. In addition, when the calcining temperature is 1,100° C. or less, the glass is softened so as to serve as a base material, and a ceramic complex contained in the base material can be obtained without dissolving the rare earth aluminate fluorescent material and the calcium fluoride.

Surface Roughening Step

The surface roughening step is a step of roughening the surface of the obtained ceramic complex. The surface roughening step may be performed prior to a processing step of processing the ceramic complex by cutting in a desired size or thickness, or may be performed after the processing step. The ceramic complex to be subjected to surface roughening is preferably a plate-shaped body having a first principal surface serving as an incident surface of light and a second principal surface serving as an emission surface of light, which is positioned on the opposite side to the first principal surface; and the surface roughening is preferably performed on the second principal surface. Examples of the surface roughening method may include a sand blast method, a rough polishing method using coarse diamond particles, a dicing method, a chemical etching method.

Processing Step

The processing step is a step of cutting the obtained ceramic complex into a desired size or thickness. A known method can be utilized for the cutting method, and examples may include blade dicing, laser dicing, and a cutting method using a wire saw. Among others, a wire saw is preferred since the cut surface becomes flat with high accuracy. By the processing step, a ceramic complex having a desired size or thickness can be obtained. The cutting is preferably performed such that the ceramic complex is formed into a plate-shaped body having a first principal surface serving as an incident surface of light and a second principal surface serving as an emission surface of light, which is positioned on the opposite side to the first principal surface. The ceramic complex preferably has a plate thickness of the plate-shaped body in a range of 90 μm or more and 300 μm or less. Among others, the plate thickness is more preferably in a range of 95 μm or more and 250 μm or less, even more preferably in a range of 100 μm or more and 200 μm or less. When the ceramic complex is a plate-shaped body and is cut into a plate thickness in a range of 90 μm or more and 300 μm or less, a ceramic complex, which is readily processed, having high wavelength conversion efficiency and enhanced light extraction efficiency, can be obtained.

Light Emitting Device

The light emitting device comprises the ceramic complex and a light source that emits light exciting the rare earth aluminate fluorescent material contained in the ceramic complex.

The light source is preferably a semiconductor laser. With this arrangement, a light emitting device, in which excitation light emitted from the semiconductor laser is incident into the ceramic complex; mixed-color light of light of which the wavelength is converted by the rare earth aluminate fluorescent material contained in the ceramic complex and the light emitted from the light source is separated into red light, green light, and blue light by plural optical systems, such as a lens array, a deflection conversion element, and a color separation optical system; and the lights are modulated according to image information to thereby form color image lights, can be obtained. The light emitting device can be used for a projector. The light emitting device using a semiconductor laser as a light source may be a light emitting device in which excitation light emitted from the semiconductor laser is incident into the ceramic complex through an optical system, such as a dichromic mirror or a collimating optical system.

The light source of the light emitting device may also be a light emitting element composed of an LED chip. When the ceramic complex is combined with a light emitting element, a light emitting device that converts light emitted from the light emitting element, and emits mixed-color light of the light emitted from the light emitting element and light of which the wavelength is converted by the rare earth aluminate fluorescent material contained in the ceramic complex, can be constituted. As the light emitting element, for example, a light emitting element that emits light having a light emission peak wavelength in a wavelength range of 350 nm or more and 500 nm or less, preferably in a wavelength range of 440 nm or more and 470 nm or less, can be used. For example, a semiconductor light emitting element using a nitride-based semiconductor ($In_X Al_Y Ga_{1-X-Y}N$, $0 \leq X$, $0 \leq Y$, $X+Y \leq 1$) can be used as the light emitting element. Using a semiconductor light emitting element as an excitation light source enables a high efficiency stable light emitting device that has high linearity of output relative to input and is resistant to mechanical shock to be obtained.

EXAMPLES

The present invention is hereunder specifically described by reference to the following Examples. The present invention is not limited to these Examples.

Production Examples of Rare Earth Aluminate Fluorescent Material

Yttrium oxide ($Y_2O_3$), cerium oxide ($CeO_2$), aluminum oxide ($Al_2O_3$), and gallium oxide ($Ga_2O_3$) were respectively weighed to be a molar ratio of 2.97:0.03:5.00:0.05 to form a raw material mixture; barium fluoride ($BaF_2$) was added thereto as a flux; and the raw material mixture and the flux were mixed using a ball mill. The mixture was put into an alumina crucible and calcined at a temperature in a range of 1,400° C. to 1,600° C. for 10 hours in a reducing atmosphere to obtain a calcined product. The resultant calcined product was dispersed in pure water, and passed through a wet-type sieve while allowing a solvent to flow and applying various vibrations through the sieve. Subsequently, the resultant product was dehydrated and dried, and then passed through a dry-type sieve to undergo classification, thereby preparing a rare earth aluminate fluorescent material having a composition represented by $(Y_{0.99}Ce_{0.01})_3(Al_{1.00}Ga_{0.01})_5O_{12}$. The average particle diameter of the resultant rare earth aluminate fluorescent material was 22 μm.

Glass

A glass powder made of barium-borosilicate glass was used. The refractive index of the glass was 1.56. The refractive index of the glass referred to a catalogue value. The softening point of the glass was 870° C. The softening point of the glass referred to a catalogue value. The content of each of elements constituting the glass was determined according to the following composition analysis. A mass percentage (% by mass) of each of elements, exclusive of oxygen, constituting the glass was measured using an ICP-AES (inductively coupled plasma emission analyzer) (manufactured by Perkin Elmer, Inc.). The composition analysis results of the glass are shown in Table 1.

TABLE 1

| Component Analysis of Glass (% by mass) | | | | | | | | |
|---|---|---|---|---|---|---|---|---|
| Ba | Si | Ca | Y | Al | Gd | Sr | Zn | B |
| 19.50 | 20.10 | 7.40 | 4.70 | 5.50 | 0.29 | 0.20 | 1.30 | 1.30 |

Calcium Fluoride

Calcium fluoride ($CaF_2$) having a purity of calcium fluoride of 99.5% by mass, an average particle diameter of 1.2 μm, and a refractive index of 1.40 was used. The purity and the refractive index of the calcium fluoride referred to catalogue values. The average particle diameter was measured by the same method and the apparatus as in the case of measuring the average particle diameter of the rare earth aluminate fluorescent material.

Example 1

A rare earth aluminate fluorescent material having an average particle diameter of 22 μm, in which the composition was represented by $(Y_{0.99}Ce_{0.01})_3(Al_{1.00}Ga_{0.01})_5O_{12}$, was used. The total amount of the rare earth aluminate fluorescent material, the glass powder, and the calcium fluoride ($CaF_2$) was taken as 100% by volume; and the rare earth aluminate fluorescent material, the glass, and the calcium fluoride ($CaF_2$) were respectively weighed to be the contents shown in Table 2 and mixed using a dry-type ball mill, thereby preparing a mixed powder for molded body. After removing balls used as a mixing medium from the mixed powder, the mixed powder was filled into a die, and a cylindrical molded body having a diameter of 17 mm and a thickness of 15 mm was formed at a load of 0.35 kg/cm². The resultant molded body was calcined using a calcining furnace (manufactured by Hirochiku Co., Ltd.) in an atmospheric atmosphere (oxygen concentration: about 20% by volume) while maintaining a temperature of 850° C. for 2 hours to obtain a ceramic complex. The resultant ceramic complex was cut into a size having a plate thickness of 720 μm using a wire saw, and the surface of the resultant sample was polished to a plate thickness of 200 μm using a surface grinder, thereby obtaining a sample of a ceramic complex.

Examples 2 to 12

A ceramic complex of each Example was obtained in the same manner as in Example 1, except that the total amount of the rare earth aluminate fluorescent material, the glass, and the calcium fluoride (CaF₂) was taken as 100% by volume, and the contents of the rare earth aluminate fluorescent material, the glass, and the calcium fluoride (CaF₂) were adjusted as shown in Table 2.

Comparative Example 1

A ceramic complex of Comparative Example 1 was obtained in the same manner as in Example 1, except that the calcium fluoride was not used, the total amount of the rare earth aluminate fluorescent material and the glass was taken as 100% by volume, and the contents of the rare earth aluminate fluorescent material and the glass were adjusted as shown in Table 2.

Comparative Example 2

A mixed powder of the rare earth aluminate fluorescent material, the glass, and the calcium fluoride (CaF₂) was filled into a die in the same manner as in Example 1, except that the total amount of the rare earth aluminate fluorescent material, the glass, and the calcium fluoride (CaF₂) was taken as 100% by volume, and the contents of the rare earth aluminate fluorescent material, the glass, and the calcium fluoride (CaF₂) were adjusted as shown in Table 2. However, the molded body could not be formed since the content of the rare earth aluminate fluorescent material exceeded 60% by volume.

Comparative Example 3

A molded body was formed in the same manner as in Example 1, except that the total amount of the rare earth aluminate fluorescent material, the glass, and the calcium fluoride (CaF₂) was taken as 100% by volume, and the contents of the rare earth aluminate fluorescent material, the glass, and the calcium fluoride (CaF₂) were adjusted as shown in Table 2. However, since the content of the calcium fluoride (CaF₂) exceeded 60% by volume, the molded body was not sintered even by the calcination, and a ceramic complex could not be obtained.

Relative Density (%)

A relative density of the ceramic complex of each of Examples and Comparative Examples was measured. The relative density of the ceramic complex of each of Examples and Comparative Examples was calculated according to the above formula (1). A true density of the ceramic complex was calculated according to the above formula (2). The calculation was performed by defining a true density of the rare earth aluminate fluorescent material used in each of Examples and Comparative Examples as 4.60 g/cm³, a true density of the glass as 3.00 g/cm³, and a true density of the calcium fluoride as 3.18 g/cm³, respectively. An apparent density of the ceramic complex was calculated according to the above formula (3).

Luminous Efficiency (%)

In regard to the sample of the ceramic complex of each of Examples and Comparative Examples, laser light having a wavelength of 455 nm was emitted from a laser diode and incident into the sample such that the light diameter of the incident light was 3.5 mm, and the radiant flux of the light emitted from the sample was measured with an integral sphere. The radiant flux of Comparative Example 1 was taken as 100%, and a relative radiant flux of the radiant flux obtained by measuring the sample of the ceramic complex of each of Examples and Comparative Examples relative to the radiant flux of Comparative Example 1 was defined as a luminous efficiency (%).

Light Diameter Ratio (Light Diameter of Emission Light/Light Diameter of Incident Light)

Figure 2:
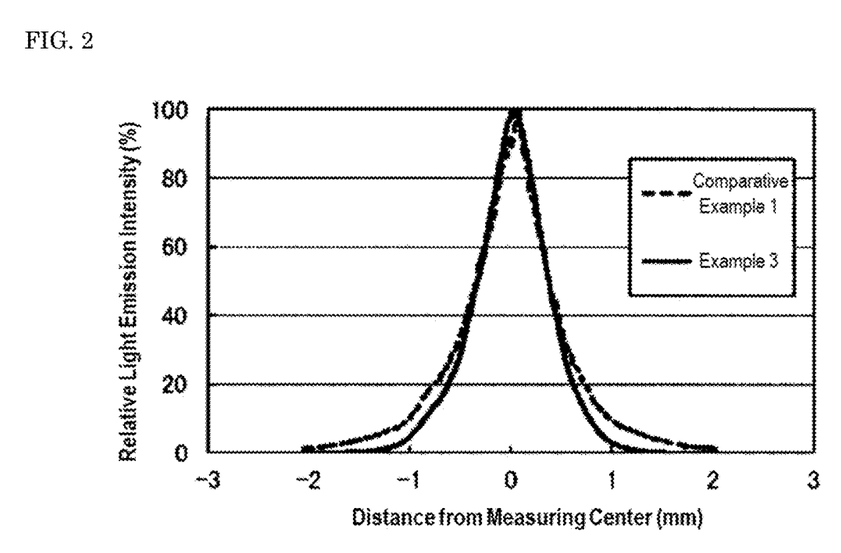
FIG. 2 shows light emission spectra each describing a relation between a relative light emission intensity and a distance from a measuring center, in ceramic complexes according to Example 3 and Comparative Example 1 of the present disclosure.

Laser light having a wavelength of 455 nm was emitted from a laser diode to the sample of the ceramic complex of each of Examples and Comparative Examples such that the light diameter of the incident light was 3.5 mm, and the light diameter of the laser light was defined as a light diameter of the incident light that was incident into the first principal surface of the sample. The light diameter of the emission light that was emitted from the second principal surface of the ceramic complex was measured as follows: light emission luminance of the light emitted from the sample of the ceramic complex of each of Examples and Comparative Examples was measured with a color luminance meter; a position exhibiting the maximum luminance in the obtained light emission spectrum was defined as a center (measuring center); distances (mm) of two positions where the luminance became one-hundredth of the maximum luminance in the light emission spectrum (one-hundredth luminance) from the measuring center were each measured in terms of an absolute value; and the sum of the absolute values of the distances (mm) of the two positions where the luminance became one-hundredth of the maximum luminance in the light emission spectrum from the measuring center was determined as the light diameter of the emission light that was emitted from the second principal surface. A light diameter ratio of the light diameter of the emission light that was emitted from the second principal surface to the light diameter of the incident light that was incident into the first principal surface was determined. FIG. 2 is a graph of light emission spectra describing a relation between a distance from a measuring center of light emitted from each of the ceramic complexes according to Example 3 and Comparative Example 1 and a relative light emission intensity (%) obtained by taking the maximum luminance as 100.

SEM Photograph

Figure 3:
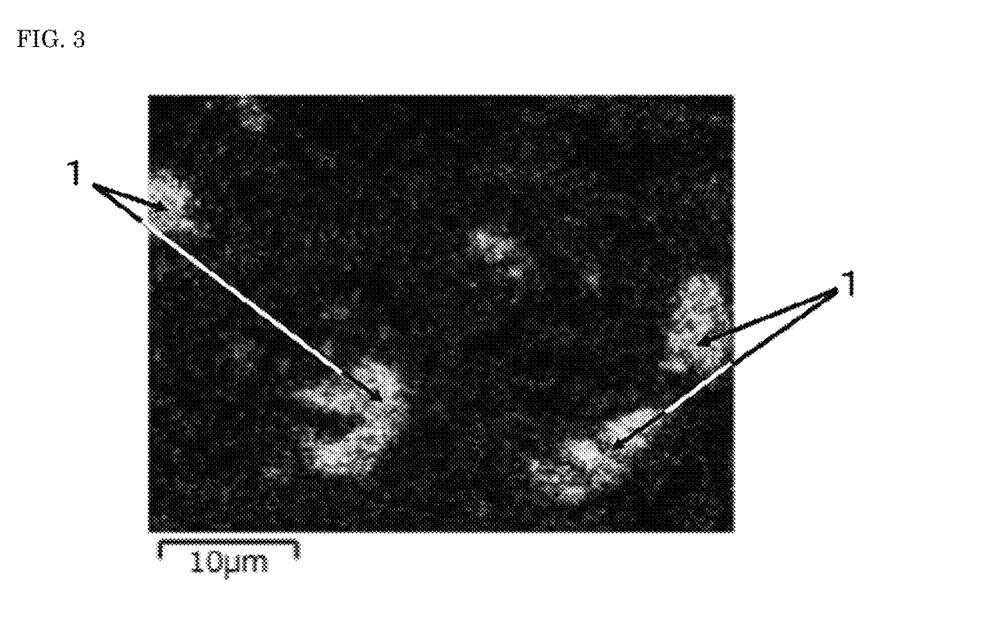
FIG. 3 is a scanning electron microscope (SEM) photograph showing a fluorine distribution, as obtained by an energy dispersive X-ray spectrometry (EDX) analysis, in the ceramic complex according to Example 3.
Figure 4:
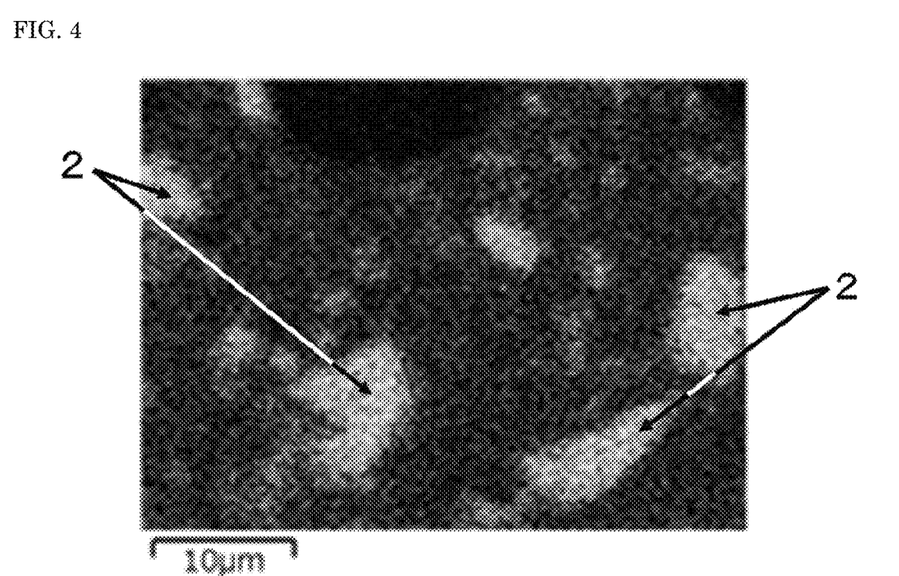
FIG. 4 is an SEM photograph showing a calcium distribution, as obtained by the EDX analysis, in the ceramic complex according to Example 3.

Fluorine in the principal surface of the ceramic complex according to Example 3 was identified by an energy dispersive X-ray spectrometry (EDX) analysis, and photographed with a scanning electron microscope (SEM). FIG. 3 is an SEM photograph identifying fluorine, as obtained by the EDX analysis, in the principal surface (first principal surface) of the ceramic complex according to Example 3. Calcium in the principal surface of the ceramic complex according to Example 3 was identified by the EDX analysis, and photographed with the SEM. FIG. 4 is an SEM photograph identifying calcium, as obtained by the EDX analysis, in the principal surface (first principal surface) of the ceramic complex according to Example 3.

as a base material, the wavelength could not be efficiently converted in the rare earth aluminate fluorescent material by scattering the incident light, and thus the luminous efficiency was decreased. In addition, the light diameter ratio of the

TABLE 2

| | Content of Each Component (% by volume) | | | Calcining Temperature (° C.) | Relative Density (%) | Luminous Efficiency (%) | Light Diameter Ratio |
|---|---|---|---|---|---|---|---|
| | Rare Earth Aluminate Fluorescent Material | Glass | Calcium Fluoride $CaF_2$ | | | | |
| Comparative Example 1 | 27.1 | 72.9 | — | 850 | 99.7 | 100.0 | 1.000 |
| Example 1 | 27.1 | 71.9 | 1.0 | 850 | 99.3 | 101.5 | 0.984 |
| Example 2 | 27.1 | 67.9 | 5.0 | 850 | 98.9 | 105.9 | 0.957 |
| Example 3 | 27.1 | 62.9 | 10.0 | 850 | 98.7 | 115.4 | 0.894 |
| Example 4 | 27.1 | 57.9 | 15.0 | 850 | 96.2 | 112.6 | 0.844 |
| Example 5 | 27.1 | 52.9 | 20.0 | 900 | 98.8 | 120.2 | 0.844 |
| Example 6 | 27.1 | 42.9 | 30.0 | 950 | 91.4 | 131.7 | 0.791 |
| Example 7 | 27.1 | 32.9 | 40.0 | 1100 | 90.9 | 144.2 | 0.768 |
| Example 8 | 27.1 | 22.9 | 50.0 | 1100 | 90.1 | 149.1 | 0.745 |
| Example 9 | 27.1 | 12.9 | 60.0 | 1100 | 90.3 | 158.8 | 0.735 |
| Example 10 | 17.8 | 72.2 | 10.0 | 850 | 97.0 | 97.0 | 0.972 |
| Example 11 | 36.6 | 53.4 | 10.0 | 900 | 95.6 | 154.3 | 0.841 |
| Example 12 | 56.5 | 33.5 | 10.0 | 1100 | 96.1 | 168.6 | 0.712 |
| Comparative Example 2 | 77.6 | 12.4 | 10.0 | — | | No molding | |
| Comparative Example 3 | 27.1 | 2.9 | 70.0 | 1100 | | No sintering | |

In the ceramic complex according to each of Examples 1 to 12, since the calcium fluoride was contained, the rate at which the incident light was transmitted without being subjected to wavelength conversion was small, and the luminous efficiency could be enhanced as compared with that of the ceramic complex in Comparative Example 1. In the ceramic complex according to each of Examples 3 to 12, since the calcium fluoride was contained in 10% by volume or more, the incident light was scattered by the calcium fluoride. By scattering the light in the inside of the ceramic complex, the wavelength was efficiently converted by the rare earth aluminate fluorescent material, and the light was emitted to the outside of the ceramic complex. Thus, the light extraction efficiency of the ceramic complex could be enhanced. The luminous efficiency of the ceramic complex in each of Examples 3 to 9, 11, and 12 was higher by 10% or more than that in Comparative Example 1.

In the ceramic complex according to each of Examples 1 to 12, the ratio (light diameter ratio (emission light/incident light)) of the light diameter of the emission light that was emitted from the second principal surface to the light diameter of the incident light that was incident into the first principal surface was in a range of 0.400 or more and 0.990 or less. With the light diameter ratio of the ceramic complex according to each of Examples 1 to 12, light that was incident into the ceramic complex according to each of Examples 1 to 12 was scattered by the calcium fluoride contained in the glass serving as a base material. Thus, the diffusion of the light on the emission surface could be suppressed as compared with the case of lower light scattering. In other words, the ceramic complex could emit light that was further converged to a nearly vertical direction to the emission surface, so that the emission light could be converged in a desired position.

The ceramic complex according to Comparative Example 1 did not contain the calcium fluoride. Accordingly, the incident light was readily transmitted from the glass serving as a base material, the wavelength could not be efficiently converted in the rare earth aluminate fluorescent material by scattering the incident light, and thus the luminous efficiency was decreased. In addition, the light diameter ratio of the ceramic complex according to Comparative Example 1 was 1.0, so that the light emitted from the ceramic complex could not be converged.

As shown in FIGS. 3 and 4, fluorine-containing part 1 that was identified in the principal surface (first principal surface) of the ceramic complex according to Example 3 and calcium-containing part 2 that was identified in the principal surface (first principal surface) of the ceramic complex according to Example 3 were overlapped. Thus, it could be confirmed that the calcium fluoride was present as it was in the ceramic complex, without reacting with the rare earth aluminate fluorescent material or the glass and without dissolving by the calcination The ceramic complex according to an embodiment of the present disclosure can be utilized for lighting systems for automobile and ordinary lighting, backlights of liquid crystal display devices, and light sources of projectors, in combination with a light emitting element such as an LED or an LD.

The invention claimed is:

1. A ceramic complex, comprising a rare earth aluminate fluorescent material, glass, and calcium fluoride,
    wherein, when the total amount of the rare earth aluminate fluorescent material, the glass, and the calcium fluoride is taken as 100% by volume, the content of the rare earth aluminate fluorescent material is in a range of 18% by volume or more and 60% by volume or less, the content of the glass is in a range of 3% by volume or more and 84% by volume or less, and the content of the calcium fluoride is in a range of 10% by volume or more and 60% by volume of less,
    wherein the calcium fluoride is a plurality of single crystals having a purity of calcium fluoride of 99.0% by mass and
    the calcium fluoride has a lower refractive index than the glass, wherein a composition of the rare earth aluminate fluorescent material is represented by the following formula (I):

(I)

wherein Ln represents at least one element selected from the group consisting of Y, Gd, Lu, and Tb; and a, b, and c each satisfy $0<a\leq0.022$, $0\leq b\leq0.4$, $0<c\leq1.1$, and $0.9\leq b+c\leq1.1$.

2. The ceramic complex according to claim 1, wherein the ceramic complex has a first principal surface serving as an incident surface of light and a second principal surface serving as an emission surface of light, which is positioned on an opposite side to the first principal surface; and a plate thickness thereof is in a range of 90 μm or more and 300 μm or less.

3. The ceramic complex according to claim 1, wherein an average particle diameter of the rare earth aluminate fluorescent material is in a range of 15 μm or more and 40 μm or less.

4. The ceramic complex according to claim 2, wherein a ratio of a light diameter of emission light that is emitted from the second principal surface to a light diameter of incident light that is incident into the first principal surface is in a range of 0.400 or more and 0.990 or less.

5. A light emitting device, comprising the ceramic complex according to claim 1 and a light source that emits light exciting the rare earth aluminate fluorescent material.

6. The light emitting device according to claim 5, wherein the light source is a semiconductor laser.

7. A method for producing a ceramic complex, comprising:
preparing a molded body containing a rare earth aluminate fluorescent material, glass, and calcium fluoride, wherein the content of the rare earth aluminate fluorescent material is in a range of 18% by volume or more and 60% by volume or less, the content of the glass is in a range of 3% by volume or more and 84% by volume or less, and the content of the calcium fluoride is in a range of 10% by volume or more and 60% by volume of less, relative to the total amount of the rare earth aluminate fluorescent material, the glass, and the calcium fluoride by volume; and
calcining the molded body,
wherein calcium fluoride is a plurality of single crystals having a purity of calcium fluoride of 99.0% by mass and
the calcium fluoride has a lower refractive index than the glass,
wherein a composition of the rare earth aluminate fluorescent material is represented by the following formula (I):

(I)

wherein Ln represents at least one element selected from the group consisting of Y, Gd, Lu, and Tb; and a, b, and c each satisfy $0<a\leq0.022$, $0\leq b\leq0.4$, $0<c\leq1.1$, and $0.9\leq b+c\leq1.1$.

8. The method for producing a ceramic complex according to claim 7, wherein the calcining temperature is in a range of 800° C. or more and 1,100° C. or less.

9. The method for producing a ceramic complex according to claim 7, wherein the molded body is calcined in an atmosphere containing 5% by volume or more oxygen.

10. The method for producing a ceramic complex according to claim 7, wherein an average particle diameter of the rare earth aluminate fluorescent material is in a range of 15 μm or more and 40 μm or less.

11. The ceramic complex according to claim 1, wherein, when the total amount of the rare earth aluminate fluorescent material, the glass, and the calcium fluoride is taken as 100% by volume, the content of the rare earth aluminate fluorescent material is in a range of 27.1% by volume or more and 60% by volume or less.

12. The method for producing a ceramic complex according to claim 7, wherein the content of the rare earth aluminate fluorescent material is in a range of 27.1% by volume or more and 60% by volume or less relative to the total amount of the rare earth aluminate fluorescent material, the glass, and the calcium fluoride by volume.

* * * * *